(12) United States Patent
Suyama

(10) Patent No.: US 10,665,538 B2
(45) Date of Patent: May 26, 2020

(54) SEMICONDUCTOR DEVICE

(71) Applicant: OLYMPUS CORPORATION, Tokyo (JP)

(72) Inventor: Takuro Suyama, Ina (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/959,343

(22) Filed: Apr. 23, 2018

(65) Prior Publication Data

US 2018/0308794 A1   Oct. 25, 2018

Related U.S. Application Data

(63) Continuation of application No. PCT/JP2015/080324, filed on Oct. 28, 2015.

(51) Int. Cl.
*H01L 23/522* (2006.01)
*H01L 23/48* (2006.01)
*H01L 21/768* (2006.01)

(52) U.S. Cl.
CPC ........ *H01L 23/5226* (2013.01); *H01L 23/481* (2013.01); *H01L 21/76802* (2013.01)

(58) Field of Classification Search
None
See application file for complete search history.

(56) References Cited

U.S. PATENT DOCUMENTS

2003/0227079 A1\* 12/2003 Chia .................. H01L 23/3114
                                                                 257/723
2010/0102454 A1   4/2010 Akiyama
2010/0225004 A1\* 9/2010 Igarashi ........... H01L 21/76898
                                                                 257/774
2010/0327383 A1  12/2010 Hayasaki et al.
(Continued)

FOREIGN PATENT DOCUMENTS

| JP | H05-009730 A | 1/1993 |
| JP | H11-251433 A | 9/1999 |
| JP | 2000-091423 A | 3/2000 |

(Continued)

OTHER PUBLICATIONS

International Search Report dated Jan. 12, 2016 issued in PCT/JP2015/080324.
(Continued)

*Primary Examiner* — Michelle Mandala
(74) *Attorney, Agent, or Firm* — Scully, Scott, Murphy & Presser, P.C.

(57) ABSTRACT

A semiconductor apparatus includes a semiconductor device having a semiconductor circuit formed on a first main surface, and including a via having an opening at a second main surface, a first wiring disposed on the first main surface of the semiconductor device, partially exposed at a bottom surface of the via, and connected to the semiconductor circuit, a first insulating layer covering the first wiring, and a redistribution wiring extending from a contact portion in contact with the first wiring at the bottom surface of the via, (Continued)

through an inside of the via and onto the second main surface, where a first through hole is formed in the first wiring, and the contact portion is in contact with a plurality of surfaces of the first wiring.

1 Claim, 9 Drawing Sheets

(56) References Cited

U.S. PATENT DOCUMENTS

2014/0175651 A1 6/2014 Pelto et al.
2014/0203412 A1 7/2014 Wang et al.

FOREIGN PATENT DOCUMENTS

| JP | 2010-205921 A | 9/2010 |
| JP | 2011-009645 A | 1/2011 |
| JP | 2011-119432 A | 6/2011 |
| JP | 2012243953 A | 12/2012 |
| JP | 2014-120504 A | 6/2014 |

OTHER PUBLICATIONS

Extended European Search Report dated Jul. 29, 2019, received in European Patent Application No. 15 90 7235.4.

* cited by examiner

SEMICONDUCTOR DEVICE

CROSS REFERENCE TO RELATED APPLICATION

This application is a continuation application of PCT/JP2015/080324 filed on Oct. 28, 2015, the entire contents of which are incorporated herein by this reference.

BACKGROUND OF INVENTION

1. Field of the Invention

The present invention relates to a semiconductor apparatus including a semiconductor device having a semiconductor circuit formed on a first main surface and including a via having an opening at a second main surface, and a redistribution wiring extending from a contact portion on a bottom surface of the via onto the second main surface.

2. Description of the Related Art

In recent years, demands for miniaturization, reduced thickness and the like of a semiconductor apparatus have been on the increase. Accordingly, a semiconductor apparatus of a chip size package (CSP) type having a through-hole wiring penetrating a semiconductor device is being developed. Japanese Patent Application Laid-Open Publication No. 2010-205921 discloses a semiconductor apparatus in which a wiring on a first main surface where a semiconductor circuit of a semiconductor device is formed is extended to a second main surface via a redistribution wiring. The redistribution wiring is electrically connected by coming into contact with a back surface, of the wiring on the first main surface, exposed on a bottom surface of a via having an opening at the second main surface.

Note that Japanese Patent Application Laid-Open Publication No. 5-09730 discloses a manufacturing method of a semiconductor apparatus with reduced contact resistance at a via. According to such a manufacturing method of a semiconductor apparatus, to increase a surface area of a contact part, an uneven polycrystalline silicon film is disposed, and then, the polycrystalline silicon film is made into a metal silicide underlying layer by ion implantation. That is, an insulating layer where a via is formed is disposed after an uneven underlying film is disposed.

SUMMARY OF THE INVENTION

A semiconductor apparatus according to an embodiment of the present invention includes a semiconductor device having a semiconductor circuit formed on a first main surface, and including a via having an opening at a second main surface facing the first main surface, a first wiring disposed on the first main surface of the semiconductor device, forming a part of a bottom surface of the via, and connected to the semiconductor circuit, a first insulating layer covering the first wiring, and a redistribution wiring extending from a contact portion in contact with the first wiring at the bottom surface of the via, through an inside of the via and onto the second main surface, where a first through hole is formed in the first wiring, and the contact portion is in contact with a plurality of surfaces of the first wiring.

DETAILED DESCRIPTION OF THE PREFERRED EMBODIMENT(S)

First Embodiment

Hereinafter, a semiconductor apparatus 1 according to a first embodiment of the present invention will be described with reference to the drawings. Note that in the following description, respective drawings of embodiments are schematic, and the relationship between a thickness and a width of each member, the ratio of thicknesses, relative angles and the like of members are not actual, and the relationship between dimensions and the ratios may be different between the drawings. Furthermore, illustration of one or some of structural elements may be omitted.

Figure 1:
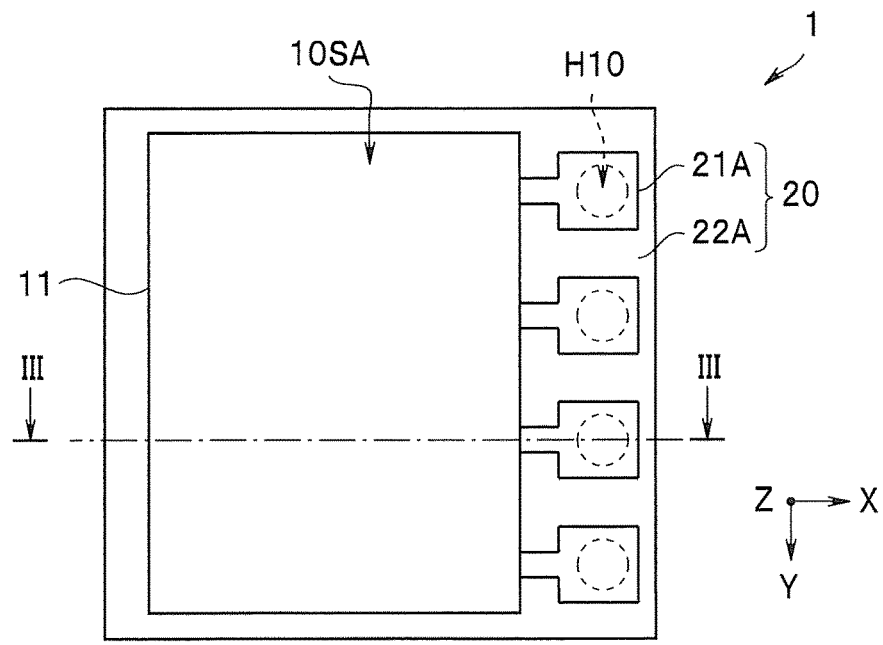
FIG. 1 is a top view of a semiconductor apparatus according to a first embodiment.
Figure 2:
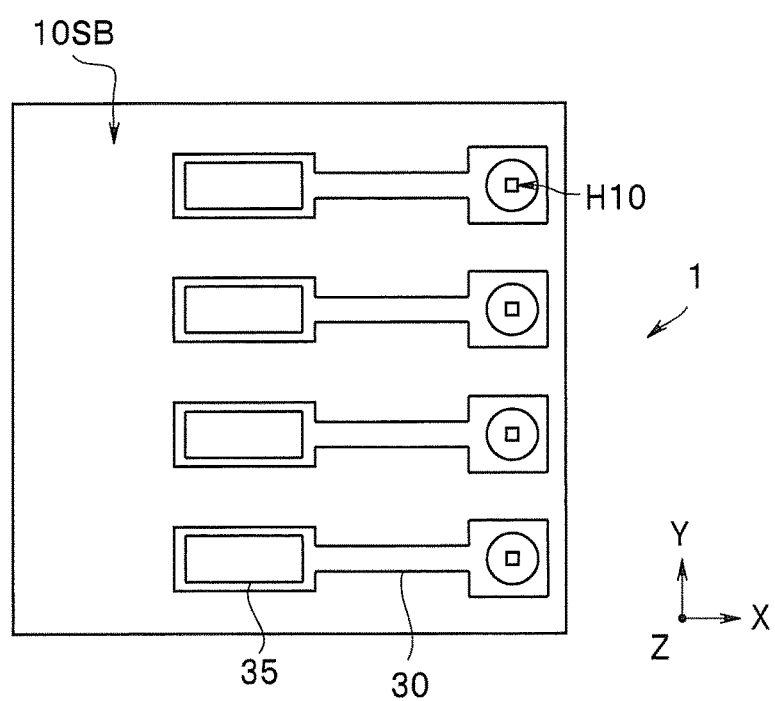
FIG. 2 is a bottom view of the semiconductor apparatus according to the first embodiment.
Figure 3:
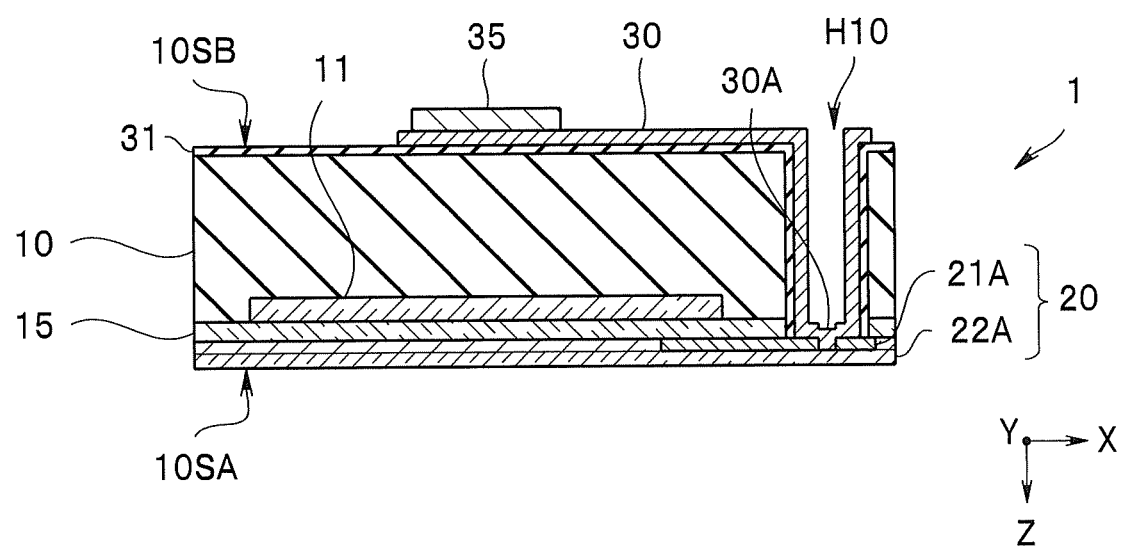
FIG. 3 is a cross-sectional view of the semiconductor apparatus according to the first embodiment, taken along a line in FIG. 1.

As shown in FIGS. 1 to 3, a semiconductor apparatus 1 according to the present embodiment is of a chip size package type including a semiconductor device 10 having a first main surface 10SA and a second main surface 10SB facing the first main surface 10SA, first wirings 21A disposed on the first main surface 10SA of the semiconductor device 10, a first insulating layer 22A covering the first wirings 21A, and redistribution wirings 30 extending to the second main surface 10SB.

A semiconductor circuit 11 is formed on the first main surface 10SA of the semiconductor device 10. The semiconductor apparatus 1 according to the present embodiment is an image pickup apparatus, and the semiconductor circuit 11 is a light receiving circuit such as a CCD or CMOS light receiving circuit.

The first main surface 10SA of the semiconductor device 10 is covered with an insulating layer 15 made of oxide, such as silicon oxide. The semiconductor circuit 11 is electrically connected to a plurality of first wirings 21A disposed on top of the insulating layer 15. The first wiring 21A transmits drive power and a drive signal to the semiconductor circuit 11, and also, transmits an output signal from the semiconductor circuit 11.

Note that in the description of the present invention, in FIG. 3 and the like, a direction of separating from the first main surface (XY plane) 10SA (i.e., an increasing direction on Z-axis) is a downward direction in the drawings, but will be referred to as an "upward direction" in accordance with order of manufacturing steps. For example, as will be described later, the first insulating layer 22A is disposed "on top of" the plurality of first wirings 21A after the plurality of first wirings 21A are disposed.

The plurality of first wirings 21A are covered with the first insulating layer 22A. That is, a multilayer film 20 including the first wirings 21A and the first insulating layer 22A is disposed on the first main surface 10SA of the semiconductor device 10.

A plurality of vias H10, each having an opening, are formed in the second main surface 10SB of the semiconductor device 10. The via H10 is a through hole which is of silicon and which penetrates the semiconductor device 10, and is a TSV (trough silicon via), a bottom surface of which is blocked by the multilayer film 20 disposed on the first main surface 10SA.

An end portion of the first wiring 21A is a substantially rectangular connection electrode. Furthermore, a back surface of the multilayer film 20 disposed on the first main surface 10SA forms the bottom surface of the via H10 formed on the second main surface 10SB. Note that a wall surface and the like of the via H10 are covered with an insulating layer 31 of silicon oxide made from TEOS, for example.

Moreover, a plurality of redistribution wirings 30, each extending onto the second main surface 10SB from a contact portion 30A in contact with the first wiring 21A at the bottom surface of respective via H10, are disposed on the second main surface 10SB of the semiconductor device 10. An electrode pad 35 is disposed at an end portion of the redistribution wiring 30.

Figure 4:
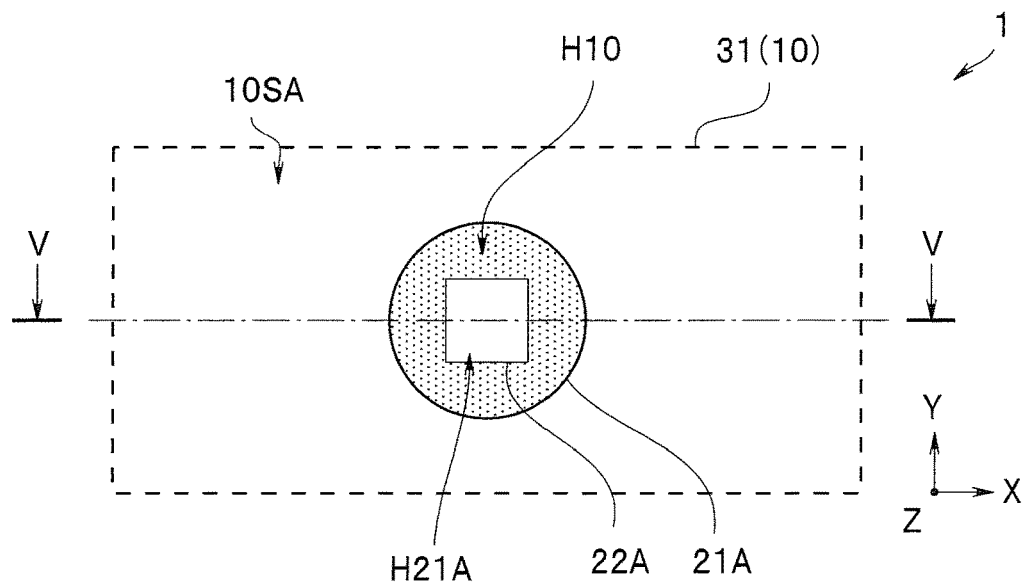
FIG. 4 is a top view, around a via, of a first wiring of the semiconductor apparatus according to the first embodiment.
Figure 5A:
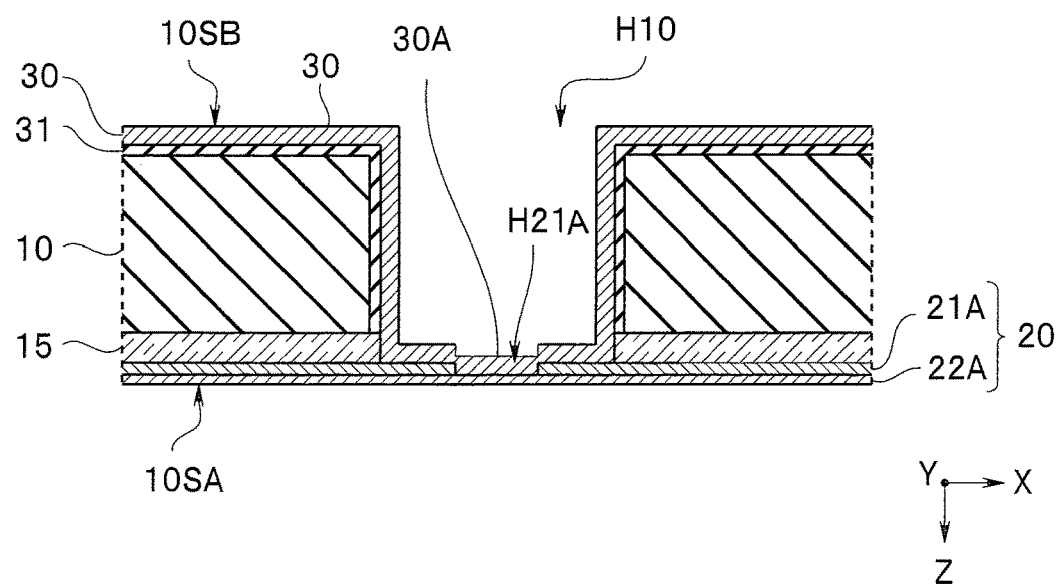
FIG. 5A is a cross-sectional view of the semiconductor apparatus according to the first embodiment, taken along a line V-V in FIG. 4.

As shown in FIGS. 4 and 5A, a through hole H21A having a substantially square cross-sectional shape is formed in the connection electrode of the first wiring 21A. Note that for the sake of description, the through hole H21A may be referred to as a first through hole.

Due to the presence of the through hole H21A, the bottom surface of the contact portion 30A of the redistribution wiring 30 is uneven. That is, a protruding portion of the contact portion 30A is in contact with the first insulating layer 22A, and a recessed portion (flat portion) is in contact with the first wiring 21A. Furthermore, the contact portion 30A is in contact not only with a back surface of the first wiring 21A, but also with a side surface of the first wiring 21A corresponding to a wall surface of the through hole H21A. That is, the contact portion 30A is in contact with a plurality of surfaces of the first wiring 21A.

Accordingly, connection reliability of the contact portion 30A of the semiconductor apparatus 1 is high.

Next, a manufacturing method of the semiconductor apparatus 1 will be briefly described. A plurality of semiconductor apparatuses 1 are simultaneously fabricated in a wafer state, and are subjected to singulation.

For example, a plurality of light receiving sections 11 are formed on the first main surface 10SA of a silicon wafer by a known semiconductor manufacturing technique. Then, the insulating layer 15 made of silicon oxide or the like is disposed on the first main surface 10SA. Next, a plurality of first wirings 21A connected to the light receiving section 11 are disposed on top of the insulating layer 15. Note that the insulating layer 15 needs to be disposed only between the first wiring 21A and a base (silicon). Moreover, in the case where the insulating layer 15 is made of a transparent material, the insulating layer 15 preferably covers the light receiving section 11 to protect the light receiving section 11.

For example, the plurality of first wirings 21A are fabricated by depositing a film of a low-resistance material, such as copper, on the entire first main surface 10SA by sputtering, and then, performing patterning by an etching process using a mask disposed by photolithography.

With the semiconductor apparatus 1, the through holes H21A are simultaneously formed, at the time of patterning of the first wirings 21A, at predetermined positions of the connection electrodes at the end portions. That is, the through holes H21A are formed by the etching process. Note that the through holes H21A may be formed by laser processing after the first wirings 21A are disposed.

Next, the first insulating layer 22A is disposed on the first main surface 10SA to cover the plurality of first wirings 21A. For example, the first insulating layer 22A preferably uses a material having a lower dielectric constant than silicon oxide, or in other words, a so-called Low-k material, to reduce parasitic capacitance. The first insulating layer 22A of the semiconductor apparatus 1 is porous SiOC (k=2.7). Porous SiOC is methyl-containing polysiloxane mainly containing many Si—CH3 groups, and is porous because gaps are caused in the molecular structure due to presence of CH3, and has a low dielectric constant k.

As the material for the first insulating layer 22A, an SiOF- or SiOCH-based porous material, a silica-based porous material such as a nano clustering silica film, H-containing polysiloxane called porous HSQ, or an organic polymer or a porous material of an organic polymer may also be used.

As described above, the first insulating layer 22A needs only to be disposed in such a manner as to cover at least the plurality of first wirings 21A. Furthermore, in the case where the first insulating layer 22A is made of a transparent material, the first insulating layer 22A preferably covers also the light receiving section 11 to protect the light receiving section 11.

Next, an etching mask with openings corresponding to the openings of the vias H10 is disposed on the second main surface 10SB of the silicon wafer. Etching from the second main surface 10SB side is performed through the mask. Here, the insulating layer 15 disposed on the first main surface 10SA is an etching stop layer, and the vias H10 penetrating the silicon wafer are thus formed. When the insulating layer 15 is removed, the back surface of the multilayer film 20 forms the bottom surfaces of the vias H10.

For example, the vias H10, the wall surfaces of which are substantially perpendicular to the main surfaces, are formed by a dry etching process such as ICP-RIE. Note that the vias H10 may each have a tapered shape, with the bottom surface smaller than the opening. For example, by using a monocrystalline silicon (100) wafer, and performing a wet etching process using an alkaline solution such as KOH or TMAH, anisotropic etching according to which an etching speed in a <100> direction is faster than an etching speed in a <111> direction is performed, and the vias H10 having a tapered-shape are thereby formed.

Then, the insulating layer 31 are disposed on inner walls of the vias H10, and the second main surface 10SB from the second main surface 10SB side by a CVD method, for example. Note that a thermally oxidized silicon film may be formed on the second main surface 10SB.

After the insulating layer 31 is removed from the bottom surfaces of the vias H10, the redistribution wirings 30 are disposed. Note that the insulating layer 31 or a part of the insulating layer 15 on the first main surface 10SA may be caused to remain at outer circumferential portions of the bottom surfaces of the vias H10 without being etched.

Figure 5B:
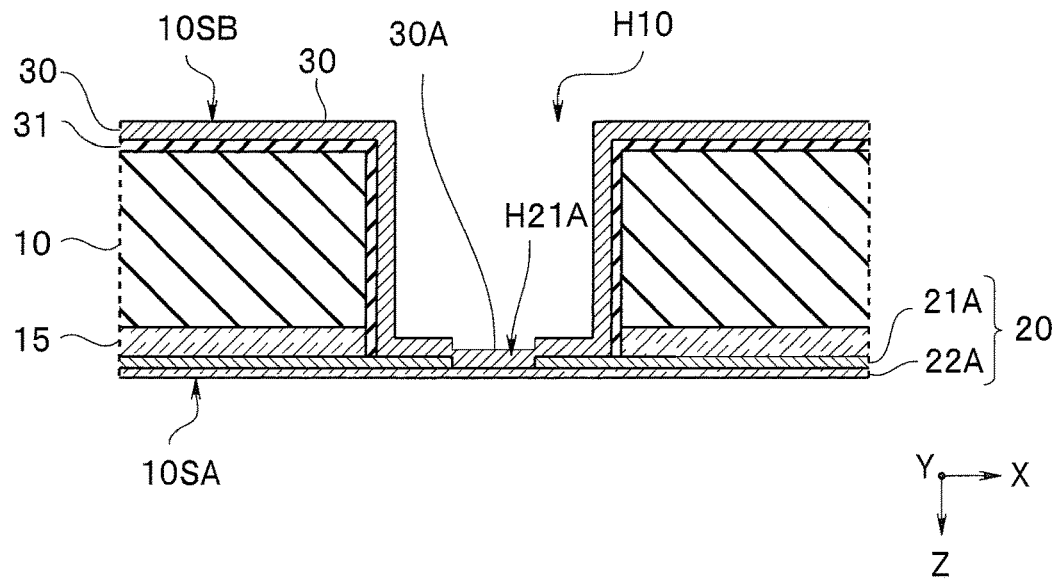
FIG. 5B is a cross-sectional view of the semiconductor apparatus according to the first embodiment, taken along the line V-V in FIG. 4.

Note that the insulating layer 31 shown in FIG. 5A is not in contact with the first wiring 21A, but the insulating layer 31 may be in contact with the first wiring 21A. For example, the insulating layer 31 shown in FIG. 5B is disposed after the insulating layer 15 is removed after the via H10 is formed, and thus, the insulating layer 31 is in contact with the first wiring 21A. The redistribution wiring 30 is disposed after the insulating layer 31 is removed from the bottom surface of the via H10 and the first wiring 21A and the first insulating layer 22A are exposed.

Figure 5C:
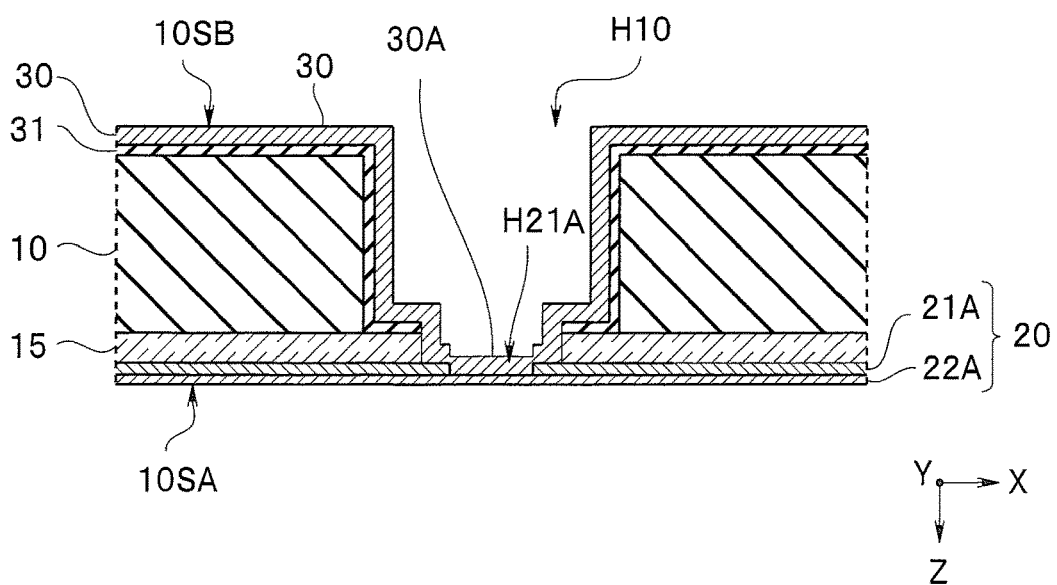
FIG. 5C is a cross-sectional view of the semiconductor apparatus according to the first embodiment, taken along the line V-V in FIG. 4.

Moreover, the insulating layer 31 shown in FIG. 5C is disposed after the via H10 is formed. Note that in FIG. 5C, the insulating layer 15 is shown as not etched at the time of formation of the via H10. However, in reality, the insulating layer 15 is also slightly etched. Then, after the insulating layer 31 is disposed, the insulating layer 31 and the insulating layer 15 on the bottom surface of the via H10 are partially removed by pattern etching, and the first wiring 21A and the first insulating layer 22A are exposed.

Now, FIG. 4 is a top view, around the via H10, of the semiconductor apparatus 1 before the redistribution wiring 30 is disposed. As shown in FIG. 4, when the via H10 penetrating the silicon wafer is formed, a part of each of the first wiring 21A and the first insulating layer 22A is exposed on the bottom surface of the via H10, on the bottom surface of the through hole H21A.

For example, the redistribution wiring 30 is made of a copper film which is disposed by pattern plating after an underlying conductive film is disposed by the CVD method.

The redistribution wiring 30 extends from the contact portion 30A on the bottom surface of the via H10, across the wall surface of the via H10 and onto the second main surface 10SB. Moreover, the electrode pad 35 for external connection, made of gold or the like, is disposed at an end portion of each redistribution wiring 30.

Note that an inside of the via H10 may be filled with a resin material or a conductive material. For example, the inside of the via H10 may be filled with copper by so-called via fill plating, simultaneously at the time of disposing the redistribution wiring 30 made of copper.

Then, the silicon wafer containing a plurality of semiconductor apparatuses is diced, and the semiconductor apparatuses are singulated.

Note that the through hole H21A of the first wiring 21A may be formed after the via H10 is formed. To form the through hole H21A to the first wiring 21A exposed on the bottom surface of the via H10, an etching process using a mask by photolithography, laser processing or the like is used.

Second Embodiment

Figure 6:
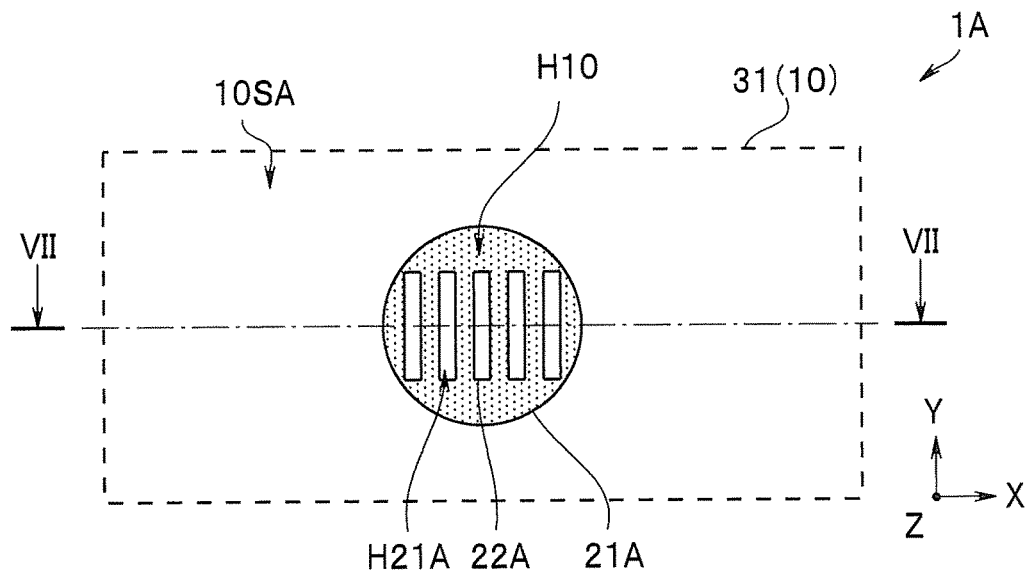
FIG. 6 is a top view, around a via, of a first wiring of a semiconductor apparatus according to a second embodiment.
Figure 7:
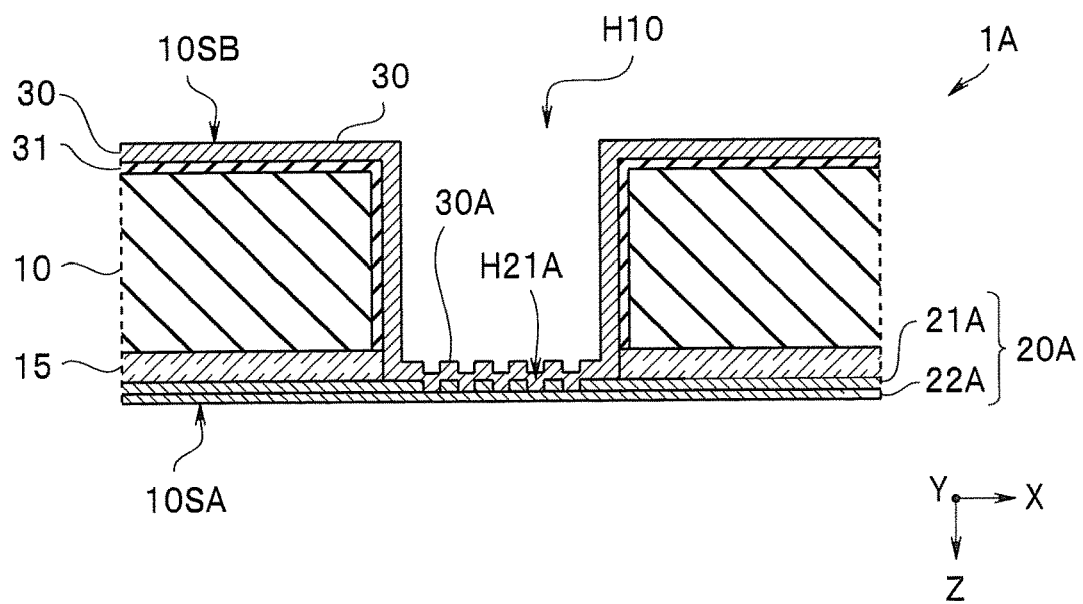
FIG. 7 is a cross-sectional view of the semiconductor apparatus according to the second embodiment, taken along a line VII-VII in FIG. 6.

In the following, a semiconductor apparatus 1A according to a second embodiment will be described with reference to FIGS. 6 and 7. Note that the semiconductor apparatus 1A is similar to the semiconductor apparatus 1, and same structural elements are denoted by same reference signs, and repeated description is omitted.

With the semiconductor apparatus 1A, a plurality of through holes (first through holes) H21A are formed in the first wiring 21A. The through holes H21A each have an elongated slit shape. That is, the multilayer film 20A is made up of the first wiring 21A where the plurality of slit-shaped through holes H21A are lined up, and the first insulating layer 22A covering the first wiring 21A.

The semiconductor apparatus 1A achieves the advantageous effect of the semiconductor apparatus 1, and also, because a plurality of recesses and protrusions are formed on the bottom surface of the contact portion 30A, and the contact portion 30A is in contact with the side surface of the first wiring 21A (side walls of the through holes H21A) at a greater area, the connection reliability is even higher.

Modifications of Second Embodiment

Figure 8:
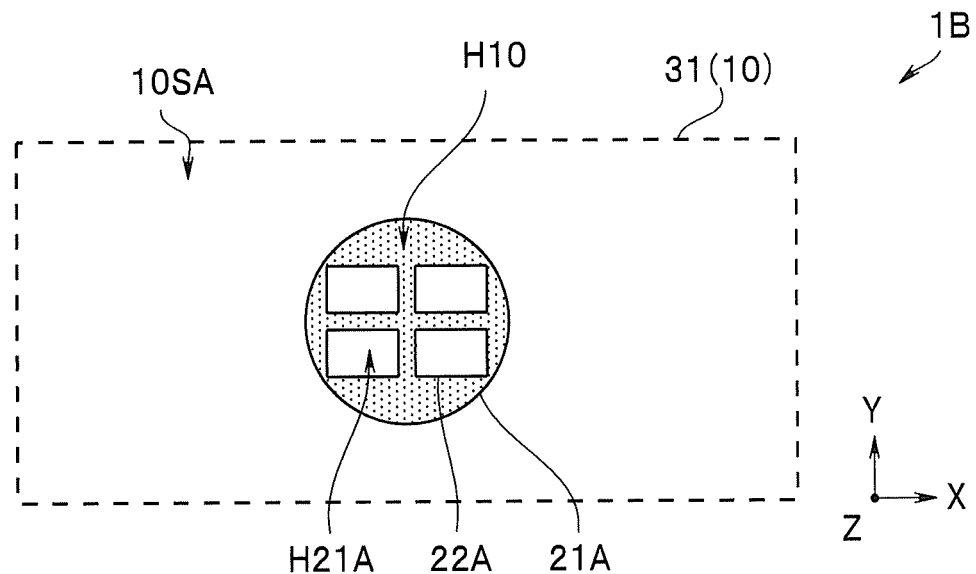
FIG. 8 is a top view, around a via, of a first wiring of a semiconductor apparatus according to a first modification of the second embodiment.

With a semiconductor apparatus 1B according to a first modification of the second embodiment shown in FIG. 8, four through holes H21A, each having a rectangular cross-sectional shape, are formed in the first wiring 21A. That is, the first insulating layer 22A is exposed at four positions of the bottom surface of the via H10.

Figure 9:
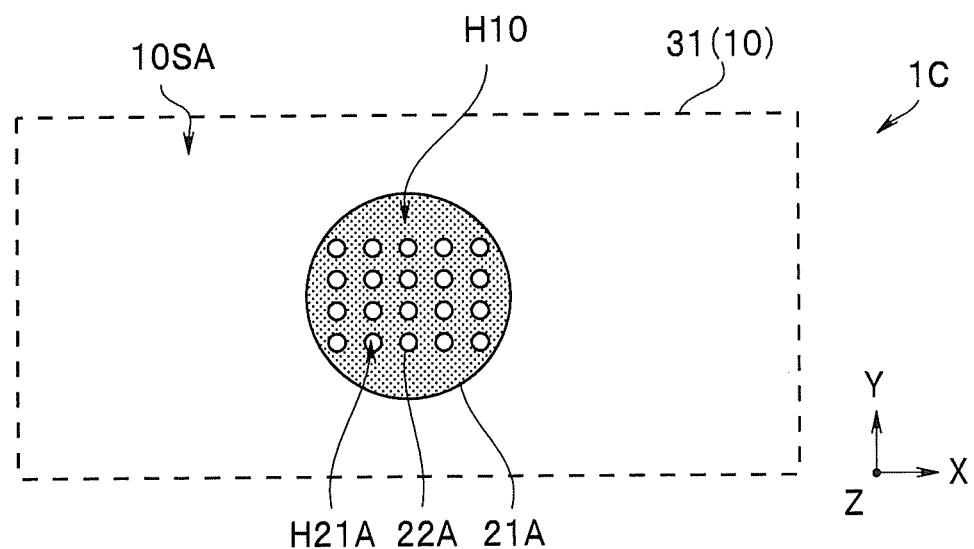
FIG. 9 is a top view, around a via, of a first wiring of a semiconductor apparatus according to a second modification of the second embodiment.

Furthermore, with a semiconductor apparatus 1C according to a second modification of the second embodiment shown in FIG. 9, twenty through holes H21A, each having a circular cross-sectional shape, are formed in the first wiring 21A.

The semiconductor apparatuses 1B, 1C achieve the same advantageous effect as the semiconductor apparatus 1. That is, the number of through holes H21A formed in the first wiring 21A is not particularly limited. Moreover, the cross-sectional shape of the through hole H21A may be a circular shape, for example.

Third Embodiment

Figure 10:
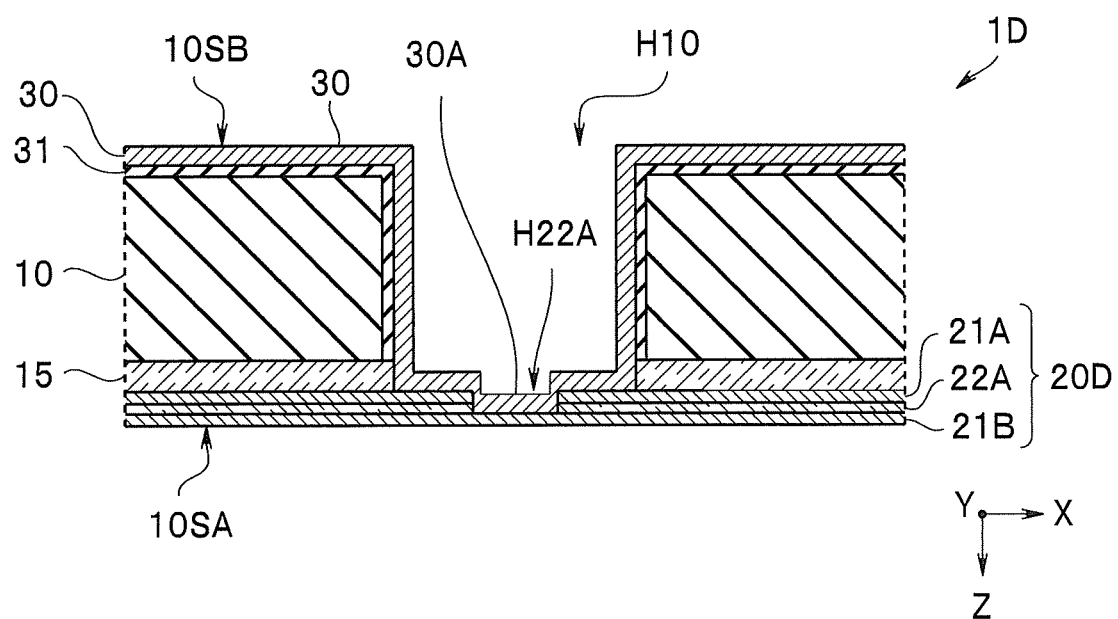
FIG. 10 is a cross-sectional view of a semiconductor apparatus according to a third embodiment.

In the following, a semiconductor apparatus 1D according to a third embodiment will be described with reference to FIG. 10. Note that the semiconductor apparatus 1D according to the present embodiment is similar to the semiconductor apparatus 1A and the like, and same structural elements are denoted by same reference signs, and repeated description is omitted.

The semiconductor apparatus 1D further includes a plurality of second wirings 21B disposed on top of the first insulating layer 22A and connected to the semiconductor circuit 11 and the respective first wirings 21A. That is, a multilayer film 20D of the first main surface 10SA is made up of the first wirings 21A, the first insulating layer 22A, and the second wirings 21B. Like the first wirings 21A, the plurality of second wirings 21B are made of copper, for example.

Note that the second wiring 21B may be directly connected to the semiconductor circuit 11, and the first wiring 21A may be connected to the second wiring 21B by a through-hole wiring penetrating the first insulating layer 22A. That is, the first wiring 21A may be indirectly connected to the semiconductor circuit 11 by the second wiring 21B. For example, the through-hole wiring penetrating the first insulating layer 22A is disposed simultaneously at the time of disposing the second wiring 21B by damascene plating. The second wiring 21B may, of course, be directly connected to the semiconductor circuit 11, and also be indirectly connected by the second wiring 21B.

Furthermore, with the semiconductor apparatus 1D, a through hole H22A penetrates the first wiring 21A and the first insulating layer 22A. Accordingly, the contact portion 30A of the redistribution wiring 30 is in contact with the second wiring 21B.

The semiconductor apparatus 1D achieves the advantageous effect of the semiconductor apparatus 1, and also, because a length of a protruding portion of the contact portion 30A (depth of the through hole H22A) is long, and the contact portion 30A is in contact with the second wiring 21B, the connection reliability is even higher.

Note that, although not shown, the through hole H21A penetrating the first wiring 21A, and the through hole H22A having a smaller outer diameter than the through hole H21A and penetrating the first insulating layer 22A may be formed.

Fourth Embodiment

Figure 11:
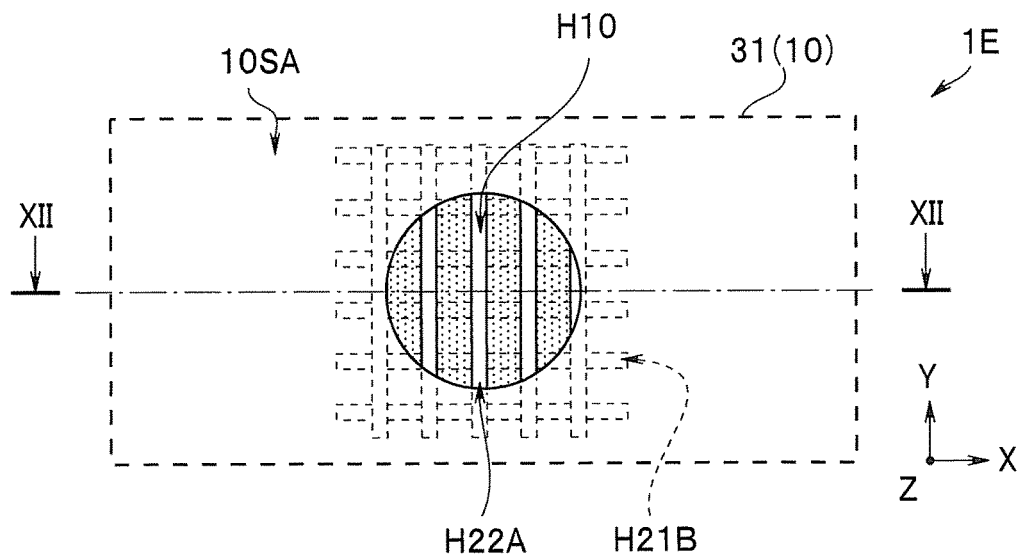
FIG. 11 is a top view, around a via, of a first wiring of a semiconductor apparatus according to a fourth embodiment.
Figure 12:
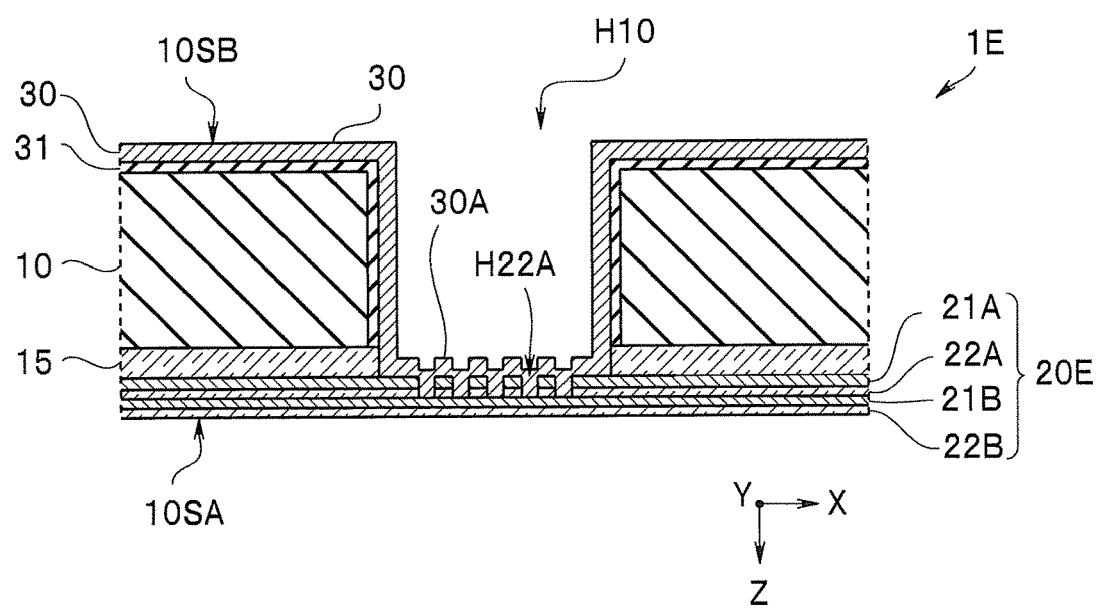
FIG. 12 is a cross-sectional view of the semiconductor apparatus according to the fourth embodiment, taken along a line XII-XII in FIG. 11.

In the following, a semiconductor apparatus 1E according to a fourth embodiment will be described with reference to FIGS. 11 to 13. Note that the semiconductor apparatus 1E according to the present embodiment is similar to the semiconductor apparatus 1A and the like, and same structural elements are denoted by same reference signs, and repeated description is omitted.

The semiconductor apparatus 1E further includes a second insulating layer 22B covering the second wiring 21B. That is, a multilayer film 20E is made up of the first wirings 21A, the first insulating layer 22A, the second wirings 21B, and the second insulating layer 22B. Like the first insulating layer 22A, the second insulating layer 22B is preferably made of a Low-k material.

Figure 13:
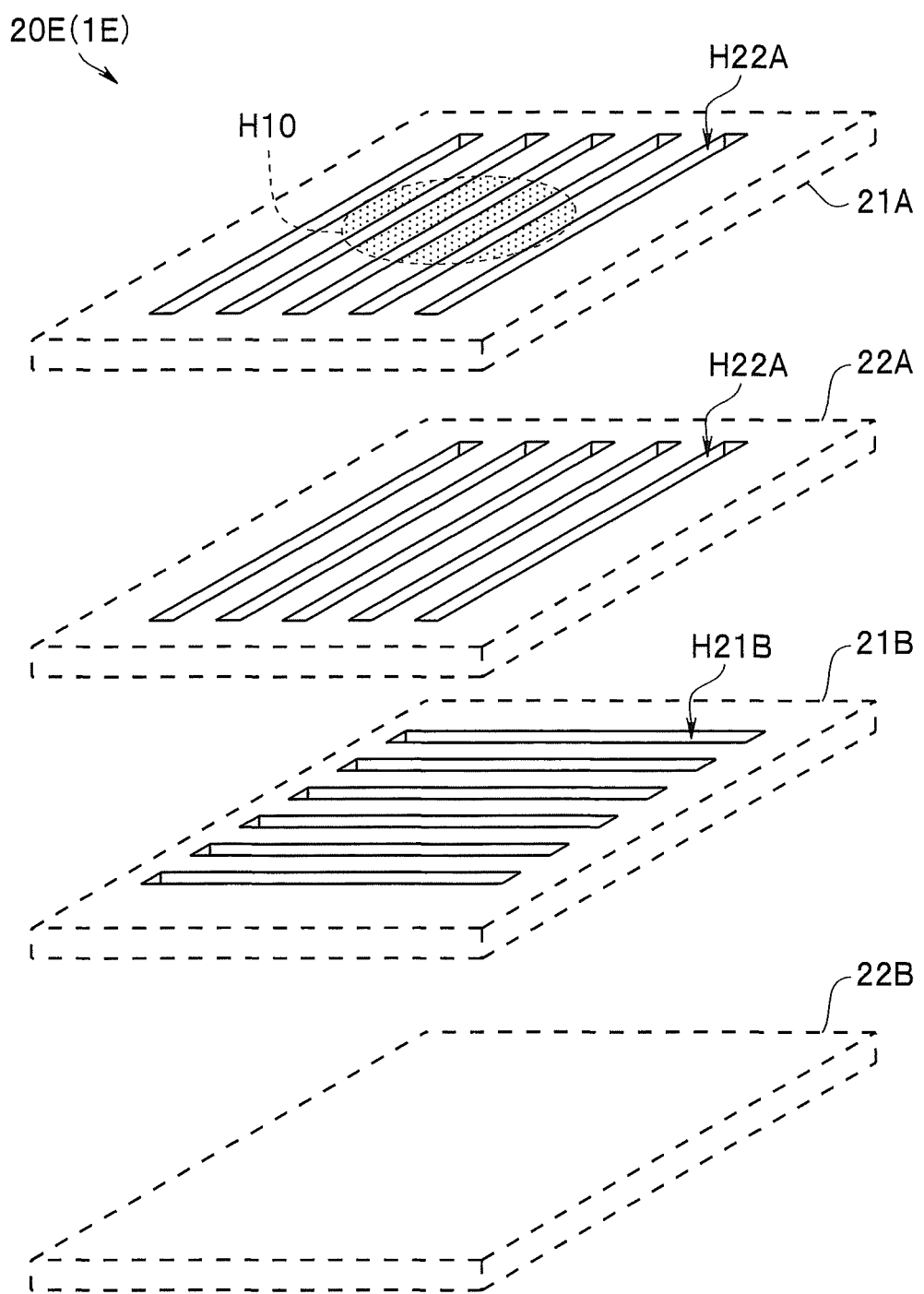
FIG. 13 is an exploded view for describing a stacking structure of a conductor layer of the semiconductor apparatus according to the fourth embodiment.

Furthermore, as shown in FIG. 13, a plurality of slit-shaped second through holes H21B are formed in a connection electrode of the second wiring 21B of the multilayer film 20E. A longitudinal direction of the second through holes H21B is perpendicular to a longitudinal direction of the through holes H22A of the first wiring 21A.

Note that with the semiconductor apparatus 1E, the through holes H22A and the second through holes H21B extend to outside the bottom surface of the via H10. The through holes H22A and the second through holes H21B achieve an advantageous effect that a stress in the multilayer film 20E is reduced.

The semiconductor apparatus 1E achieves the advantageous effect of the semiconductor apparatus 1D, and also, the stress in the multilayer film 20E is reduced, and thus, the connection reliability is even higher.

Note that with the semiconductor apparatus of the present invention, as a multilayer film, a plurality of (wiring layers/insulating layers) may be further disposed on top of the second insulating layer 22B. That is, a multilayer film made up of a plurality of (wiring layers/insulating layers) including the first wirings (wiring layer)/the first insulating layer may be disposed. Note that the insulating layer is preferably made of a Low-k material, and the wiring is preferably made of copper. Moreover, the wirings are preferably connected by a through-hole wiring penetrating the insulating layer.

Furthermore, the redistribution wiring 30 may fill the through hole penetrating the plurality of wiring layers of the multilayer film. Even when the insulating layer is made of a so-called fragile Low-k material with low mechanical strength, the through hole is filled with metal with high mechanical strength, and inter-layer connection reliability is increased.

Moreover, a slit-shaped through hole may be formed in the connection electrode of each wiring, where the slit-shaped through holes of adjacent wirings are perpendicular to each other. Furthermore, at least one of the wirings may be connected to the semiconductor circuit by a wiring which is directly connected to the semiconductor circuit.

Note that in the description given above, an image pickup apparatus using the semiconductor device 10 as an image pickup device is described as the semiconductor apparatus, but the semiconductor apparatus of the present invention is not limited to the image pickup apparatus.

The present invention is not limited to the embodiments, the modifications and the like described above, and various changes, combinations, and applications are possible without departing from the scope of the invention.

What is claimed is:

1. A semiconductor apparatus comprising:
   a semiconductor device having a semiconductor circuit formed on a first main surface, and including a via having an opening at a second main surface facing the first main surface;
   a first wiring disposed on the first main surface of the semiconductor device, forming a part of a bottom surface of the via, and connected to the semiconductor circuit;
   a first insulating layer covering the first wiring;
   a second wiring covering the first insulating layer;
   a second insulating layer covering the second wiring; and
   a redistribution wiring extending from a contact portion in contact with the first wiring at the bottom surface of the via, through an inside of the via and onto the second main surface, wherein
   a plurality of slit-shaped first through holes are formed in the first wiring and the first insulating layer, and the contact portion is in contact with a plurality of surfaces of the first wiring, and
   a plurality of slit-shaped second through holes are formed in the second wiring, in a manner perpendicular to the first through holes such that at least a portion of the first and second slit-shaped through holes overlap with each other in a longitudinal axis direction of the via.

* * * * *